(12) United States Patent
Bentlage et al.

(10) Patent No.: US 6,718,521 B1
(45) Date of Patent: Apr. 6, 2004

(54) METHOD AND SYSTEM FOR MEASURING AND REPORTING TEST COVERAGE OF LOGIC DESIGNS

(75) Inventors: David Gary Bentlage, Raleigh, NC (US); Paul David Bryan, Raleigh, NC (US); Peter Dean LaFauci, Holly Springs, NC (US); Randall Rogers Pratt, Essex Jct., VT (US)

(73) Assignee: International Business Machines Corporation, Armonk, NY (US)

( * ) Notice: Subject to any disclaimer, the term of this patent is extended or adjusted under 35 U.S.C. 154(b) by 614 days.

(21) Appl. No.: 09/638,528

(22) Filed: Aug. 14, 2000

(51) Int. Cl.[7] .............................................. G06F 17/50
(52) U.S. Cl. .................................... 716/4; 716/5; 716/6
(58) Field of Search ................................. 716/4, 5, 6, 2, 716/1, 18, 8; 714/739, 32, 39, 35, 33

(56) References Cited

U.S. PATENT DOCUMENTS

| | | | |
|---|---|---|---|
| 5,440,722 A | 8/1995 | VanderSpek et al. | 395/183.19 |
| 5,615,136 A | 3/1997 | Baratom et al. | 364/578 |
| 5,684,946 A * | 11/1997 | Ellis et al. | 714/34 |
| 5,768,567 A | 6/1998 | Klein et al. | 395/500 |
| 5,778,194 A | 7/1998 | McCombs | 395/280 |
| 5,794,012 A | 8/1998 | Averill | 395/500 |
| 5,913,043 A | 6/1999 | Carter et al. | 395/280 |
| 5,930,482 A | 7/1999 | Carter et al. | 395/280 |
| 5,943,252 A | 8/1999 | Schultz et al. | 365/49 |
| 5,956,476 A | 9/1999 | Ranson et al. | 395/183.06 |
| 5,961,625 A | 10/1999 | Carter | 710/129 |
| 5,963,722 A | 10/1999 | Carter | 395/309 |
| 5,996,034 A | 11/1999 | Carter | 710/100 |
| 6,016,554 A | 1/2000 | Skrovan et al. | 714/25 |
| 6,182,258 B1 * | 1/2001 | Hollander | 714/739 |
| 6,397,354 B1 * | 5/2002 | Ertekin | 714/34 |
| 6,530,054 B2 * | 3/2003 | Hollander | 714/739 |
| 6,594,803 B1 * | 7/2003 | Weber et al. | 716/5 |
| 2002/0002698 A1 * | 1/2002 | Hekmatpour | 716/4 |

* cited by examiner

Primary Examiner—Vuthe Siek
Assistant Examiner—Binh Tat
(74) Attorney, Agent, or Firm—Connolly Bove Lodge & Hutz LLP

(57) ABSTRACT

A method and system for easily and automatically determining the extent of test coverage for a design-under-test (DUT). Incremental test coverage information is gathered from the application of test cases to the DUT, and cumulative test coverage information is maintained. The incremental test coverage and cumulative test coverage information are fed into a correlation process, which correlates valid bus transactions automatically generated from a configuration file describing the DUT with the incremental and cumulative test coverage information. The correlation process determines which valid bus transactions have or have not been applied in testing the DUT.

15 Claims, 5 Drawing Sheets

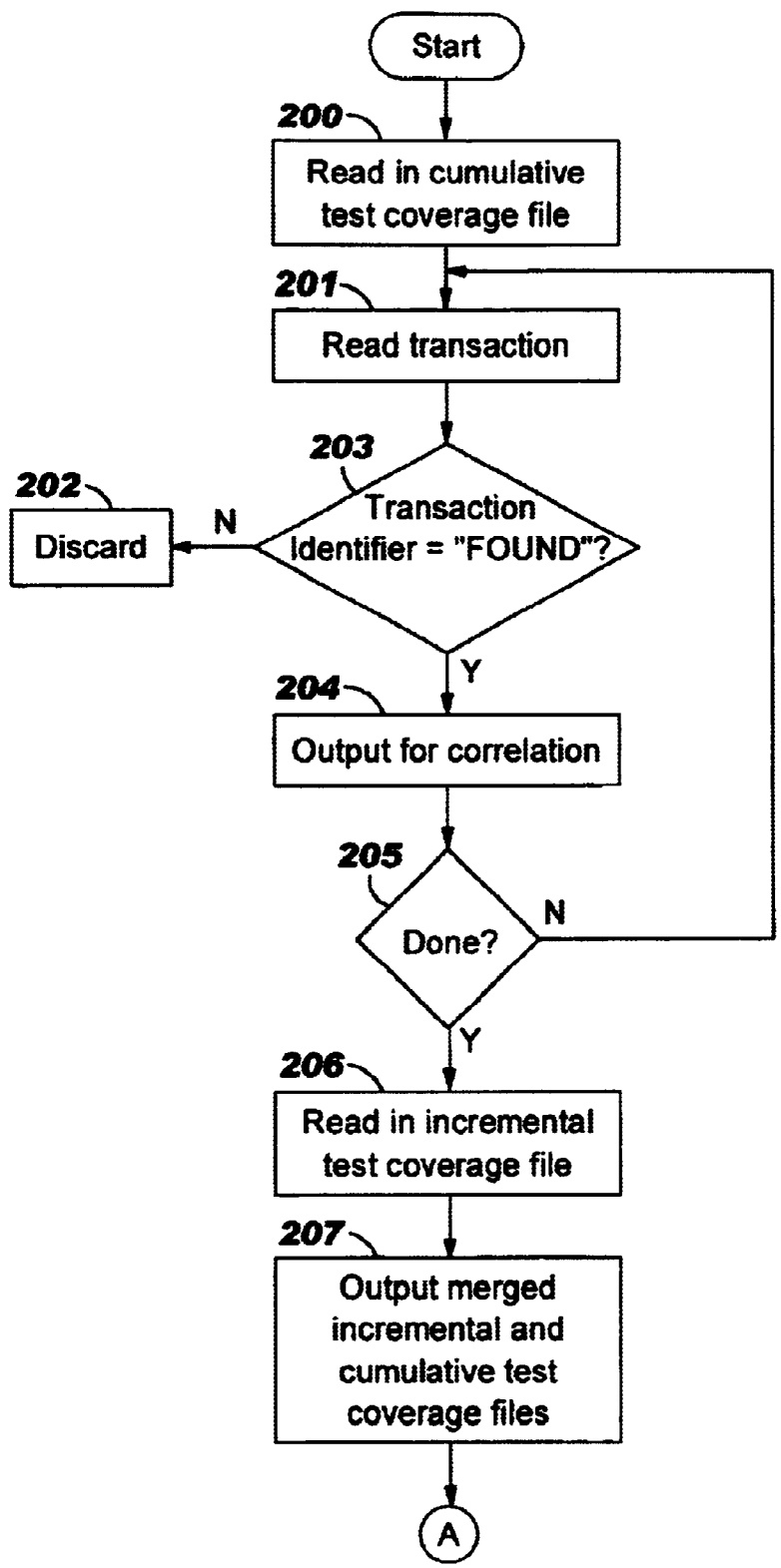

METHOD AND SYSTEM FOR MEASURING AND REPORTING TEST COVERAGE OF LOGIC DESIGNS

CROSS REFERENCE TO RELATED APPLICATIONS

This application is related by common inventorship and subject matter to co-pending applications titled "Method and System for Efficiently Generating Parameterized Bus Transactions" and "Method and System for Generating a Design-Specific Test Case From a Generalized Set of Bus Transactions". Until such time as the foregoing applications are assigned application numbers by the U.S. Patent and Trademark Office, they may be respectively referenced by the following applicant: Ser. Nos. 09/638,268 and 09/638,757. The listed applications are assigned to International Business Machines Corporation and are entirely incorporated herein by this reference.

BACKGROUND OF THE INVENTION

The present invention relates to the testing of logic designs in simulation or hardware, and more particularly to a method and system for measuring and reporting the extent of test coverage of a design-under-test (DUT) in terms of its bus transactions.

A process known as verification comprises applying test cases to a DUT and checking the results against expected results to determine whether the DUT functions correctly. Functional verification of logic designs which interface to standardized buses typically involves the use of a software tool known as a bus functional model (BFM). A BFM emulates a bus protocol to apply a test case in simulation to a DUT modeled by a hardware description language (HDL).

The BFMs allow verification engineers to write test cases as bus transactions. The bus transactions may be expressed in bus functional language (BFL) statements which are decoded and executed by the BFMs using a logic simulator. For example, a standardized BFM transaction test case for a 32 bit data slave design that uses read and write transactions with address, data, and control signal information could comprise BFL statements appearing as follows (comments indicated by "//"):

In order to verify that a DUT completely complies with a standardized bus interface, all possible bus transactions must be performed to ensure that the DUT-to-bus interface operates under all legal bus conditions. This process, also known as regression testing, entails the enumeration of all possible and legal transaction combinations to ensure a complete and correct design.

The testing of a DUT for bus compliance can be a complex and time-consuming procedure, requiring considerable computer resources. Numerous bus transactions and varied test scenarios must typically be applied. Often, executing a complete set of tests that exhausts all the possible bus transactions of a DUT at one time is impracticable. More typically, test cases must be applied in limited batches. Accordingly, tracking of the extent of test coverage for a design over a testing period to ensure that complete test coverage has been achieved becomes a difficult chore that slows the regression testing or verification process.

In view of the foregoing, a method and system for conveniently measuring and reporting the extent of test coverage is needed.

SUMMARY OF THE INVENTION

In a method and system according to the invention, incremental test coverage information from an application of a test case to a DUT is collected. The incremental test coverage information, along with cumulative test coverage information, is automatically correlated with a set of valid bus transactions corresponding to the DUT to determine the extent of the test coverage for the DUT.

In an embodiment, the correlation process uses a DUT configuration file which describes the DUT in a condensed syntax. The correlation process automatically generates possible bus transactions for the DUT from the syntax. Rules included in the syntax filter out selected ones of the possible bus transactions to produce the set of valid transactions. The valid transactions are compared with the incremental and cumulative test coverage information to determine which valid bus transactions have or have not been applied in testing the DUT.

```
read(address=F0,be=1111,data=00000034)      // 4 byte read transaction from addr F0;
                                            // byte enable (be) indicates
                                            // that bytes 0–3 are enabled;
                                            // expected data value is 00000034;
write(address=F0,be=1000,data=12000000)     // 1 byte write transaction to addr. F0;
                                            // byte enable indicates that byte 0
                                            // is enabled, and bytes 1–3 are not
                                            // enabled;
                                            // 1 byte write data is 12;
read(address=F0,be=1111,data=12000034)      // 4 byte read transaction from
                                            // address F0;
                                            // byte enable indicates that bytes 0–3
                                            // are enabled;
                                            // expected data value is 12000034;
```

In the foregoing example, read and write are two different transaction types, while address, byte enable, and data are parameters of the respective transaction types. The parameters were used to specify data to be written to an address, and to subsequently read the address to determine whether the data was correctly written.

In view of the foregoing, the present invention provides a convenient and easy-to-use measure of test coverage. The invention allows a user to apply relatively small sets of tests and incrementally build toward total coverage. A user can combine the information of multiple test case applications, either in simulation or hardware, and measure not only what percentage of coverage has been achieved, but what remaining transactions are needed to accomplish full coverage.

BRIEF DESCRIPTION OF THE DRAWINGS

FIGS. 2A–2C show process flows for correlating and reporting test coverage data according to the invention.

DETAILED DESCRIPTION OF THE INVENTION

Figure 1A:
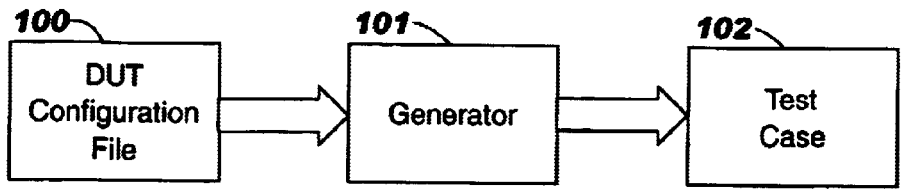
FIGS. 1A–1C illustrate the invention in functional block diagram form in terms of a processing or information flow.

Referring now to FIG. 1A, a DUT configuration file 100 describing a DUT in terms of the bus transactions that it executes may be processed by a generator program 101 to produce a test case 102 comprising one or more bus transactions. The DUT configuration file may be expressed in a condensed or compact syntax, described in greater detail below, which allows for a description of the bus transactions of a particular bus architecture or of a DUT to be expressed in an economical form suitable for being expanded or enumerated by the generator program. The generator program forms transaction parameter combinations and tests them against rules to determine whether a combination should be included in a test case, as described in more detail hereinafter.

Figure 1B:
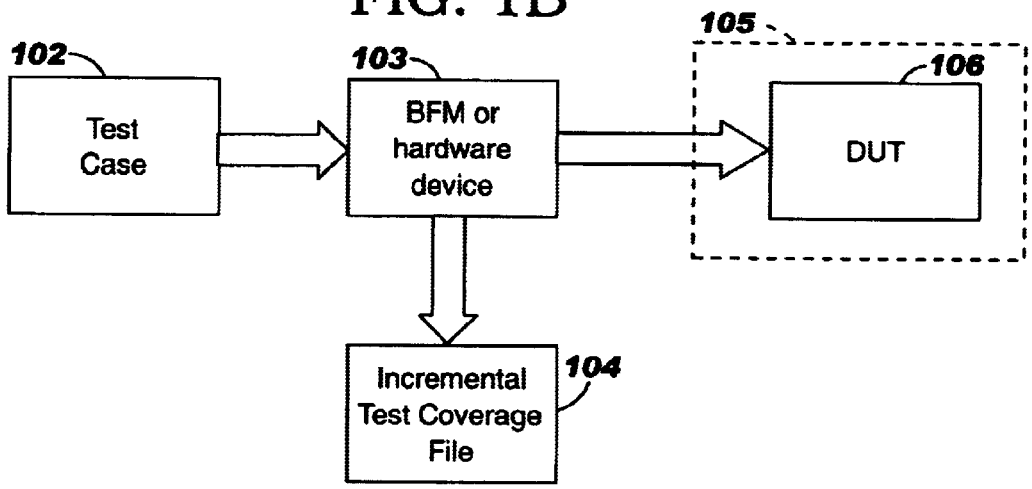

The test case 102 is typically expressed as bus functional language statements as in the example given above. As shown in FIG. 1B, the test case may be applied by a BFM or hardware device 103 to a DUT 106 for verification; reference numeral 105 refers to either a logic simulator for simulating an HDL model of the DUT, or a hardware environment including a physical embodiment of the DUT 106. Known monitoring or trace mechanisms can capture the bus transactions applied by the test case in an incremental test coverage file 104.

Figure 1C:
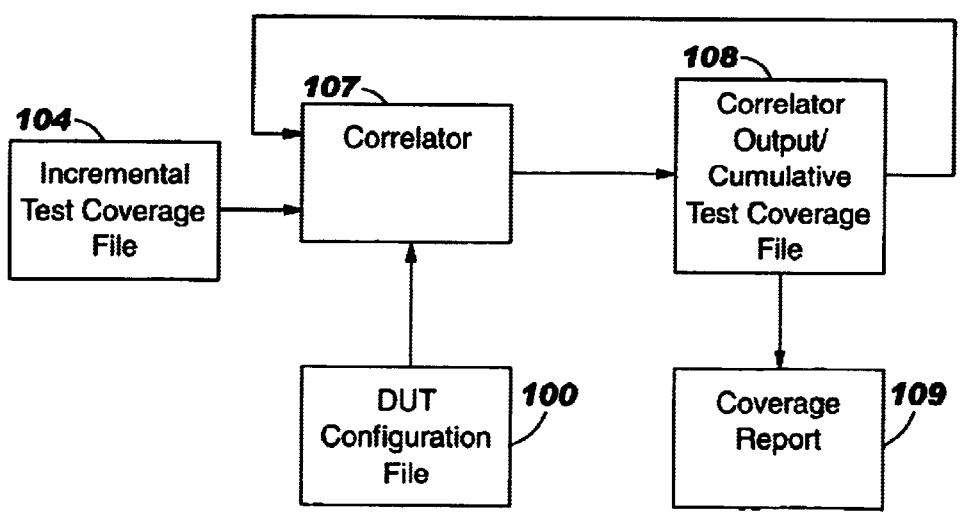

Subsequently, as shown in FIG 1C, the incremental test coverage file 104 may be processed by a correlator 107 according to the invention. The correlator 107 produces a cumulative test coverage file 108, which is provided as a feedback input to the correlator along with the incremental test coverage file. A coverage report 109, detailing the extent of test coverage achieved for the DUT 106, along with remaining transactions or test cases needed to accomplish full coverage, may be generated from the cumulative test coverage file 108.

In operation, the correlator correlates or compares the information in the incremental test coverage file 104 and the cumulative test coverage file 108 with information that it derives from the DUT configuration file 100. Similarly to the generator 101 described above, the correlator forms transaction parameter combinations and tests them against rules as specified in the DUT configuration file. The parameter combinations and rules are specific to a particular DUT and describe a DUT-to-bus interface for the bus architecture that is or will be used with the DUT. More specifically, the correlator forms possible parameter combinations as defined in the configuration file, and the rules filter out parameter combinations that are invalid for a particular DUT. Thus, those parameter combinations that are allowed by the rules represent all the valid transactions for the DUT.

In comparing the valid transactions derived from the DUT configuration file with the information in the incremental test coverage file 104 and cumulative test coverage file 108, the correlator determines which of the valid transaction set of the DUT have been applied in test cases, and which have not. It also detects invalid or unknown bus transactions. The correlator outputs this information cumulatively to the cumulative test coverage file 108. Thus, an extent of test coverage of the DUT, up to the point of a particular execution of the correlator, and those remaining transactions, if any, which are needed to effect complete coverage can be readily determined and reported in a coverage report 109.

As noted above, a condensed or compact syntax for the configuration file according to the invention allows for a description of a DUT, in terms of the bus transactions it performs, to be expressed in an economical form with a minimum of effort and probability of coding error. The DUT file may, among other uses, be used by the generator 101 to generate a test case 102. The correlator 107 functions similarly to generator in that it generates possible bus transactions filtered by rules, but includes the function of correlating or comparing generated bus transactions to the incremental and cumulative test coverage files to determine test coverage.

A description of a possible embodiment of the configuration file syntax follows. Comments are indicated by "//". It is noted that the form of the syntactical statements described is arbitrary and merely representative of functionality which could be implemented in a wide variety of symbolic formulations suitable for being parsed by a parsing routine.

configuration [name]

This syntactical statement specifies a bus architecture type. Each bus architecture is characterized by a set of transactions, and typically a subset of those transactions constitutes an interface with a given DUT.

path [device_path]

This syntactical statement specifies a logical path in a testing system hierarchy to a device or software entity, such as a BFM, that is used to apply a test case to a DUT.

device_type[name]

This syntactical statement specifies a type of device in a given bus architecture, such as a slave, master or arbiter, used to apply a test case to a DUT.

trans_type

[command1] [command2] [command3] . . .

end_trans_type

This syntactical statement specifies bus transaction types ("command"). Examples include "read" and "write". The correlator will generate bus transactions of the transaction types and including parameter combinations as determined by a command statement, discussed below.

generate

// specification of a list of transaction types list [command1] [command2] [command3] . . .

// specification of an integer=n, where n is a number of transaction types to be selected at random from the trans_type list uniform [integer]

end generate

This syntactical statement specifies a way in which bus transaction types are generated by the correlator program. In the list format, a user lists transaction types. The correlator will generate all the possible combinations of the listed transaction types, along with associated parameters as specified by the command statement described below.

An alternative format for the generate syntactical statement is to specify the keyword uniform followed by an integer. This format will cause the specified integer number of transaction types to be selected at random from the list set forth in the trans_type statement.

command
    // for an enumerated list
    [parameter name] [enum] [item1] [item2] [item3] . . .
    // for a range of values, or a uniform random distribution within a range
    [parameter name] [uniform or range] [min_value] [max_value] [step] /step_value]
    // for type range: step and step_value are optional
end command This syntactical statement allows a user to specify all of the parameters, and all of the possible parameter values for each parameter, that are valid for a given bus architecture.

Following the command identifier are parameter combination specifications. Possible formats for specifying parameter combinations include enum, uniform, and range, as shown. For parameter combination specifications of type enum, the parameter values follow the keyword enum in the form of an enumeration list. As discussed in greater detail below, when the correlator processes a parameter combination specification of the enum type, it will combine each of the listed parameter values with other parameter specifications of the command statement using an enumeration routine. Depending upon applied rules, the correlator will filter out invalid combinations.

For parameter combination specifications of type uniform and range, a user specifies minimum (min_value) and maximum (max_value) values following the corresponding keyword. For specifications of type uniform, the correlator will choose a random value between the minimum and maximum values when generating parameter combinations.

For specifications of type range, a user may choose a step value or increment between the minimum and maximum values. This is accomplished through the use of the step keyword followed by a value indicating the step value (step_value). When processing parameter combination specifications of type range, the correlator sets the parameter to the minimum range value and then increments the value by the specified step value to generate parameter combinations. The step and step_value keywords are optional. If step and step_value are not included within the parameter combination specification, then the step_value defaults to 1 and all possible values within the minimum and maximum values are generated.

Different formats may be used for range and uniform specifications, including decimal, binary, and hexadecimal. To specify a format, special characters may be included before the min_value and max_value keywords. Hexadecimal may be chosen by including an "x" character and binary by including a "b". Preferably, decimal is the default.

Examples:
    x10 // hexadecimal value, equal to 16 decimal
    b10 // binary value, equal to 2 decimal
    10 // decimal value
rule [include or exclude] [rule_name] // optional rule specifications
    [eq or ne] [parameter name] [item 1] [item2] [item3]
    [lt or gt] [parameter name] [value]
    [eq or ne] [parameter name] [mask] [mask_value] [value] [test_value]
end_rule This syntactical statement allows a user to restrict the total set of bus transactions generated, as defined by the command specifications, to be used in determining test coverage. Rules may specify the actions exclude or include to exclude or include, respectively, a combination of parameters and parameter values for the bus transactions, based upon the results of tests specified by the user. The tests include different types of relational operators, such as: equal (eq), not equal (ne), less than (lt), or greater than (gt).

In the first format shown above for specifying a test (the line reading [eq or ne] [parameter name] [item 1] [item2] [item3]), each combination of a list item ([item 1], [item2], or [item3]) with [parameter name] is compared to a generated combination using the specified relational operator [eq or ne]. Each test returns a true condition or a false condition.

In the second format shown (the line reading [lt or gt] [parameter name] [value]), [parameter name] is compared with [value] using the specified relational [lt or gt]. Each test returns a true condition or a false condition.

In the third format shown, tests may be specified using a mask format. With the mask format, the value specification is masked with the mask_value specification. The result is then tested against test_value using the appropriate relational operator (eq or ne).

If all the tests specified in a rule return a true condition, then the specified action is performed. That is, if all tests return a true condition and the rule specifies include, the parameter combination is used by the correlator as a valid transaction. If the rule specifies exclude, the parameter combination is not used.

If any test returns a false condition, then the action opposite to the action specified is performed. That is, if any test returns a false condition and the action specified is include, the parameter combination is excluded. If the action specified is exclude, the parameter combination is included as a valid transaction.

If more than one rule is stated in a configuration file, a first logical AND operation is performed with the conditions returned by evaluating all the tests specified for exclude actions. A logical OR operation is performed with the conditions returned by evaluating all the tests specified for include actions.

Then, a second logical AND operation is performed with results of the first logical AND and the logical OR operations. The second logical AND operation returns a true or false condition to determine whether to include the parameter combination or combinations for which rules are specified.

If no rules are included in a configuration file, all the parameter combinations corresponding to the command statement specification are generated or enumerated. As described above, the iterations statement may limit the number of transactions generated.

rule [NA] [parameter name] (optional)
    [eq or, ne] [parameter name] [item1] [item2] [item3]
    [lt or gt] [parameter name] [value]
    [eq or ne] [parameter name] [mask] [mask_value] [value] [test_value]
end_rule This syntactical statement allows for the omitting of certain parameters under specific conditions during parameter generation. The tests under the NA (Not Applicable) formulation use relational operators as in the include/exclude rules described above.

In order for a parameter to be evaluated as Not Applicable and therefore excluded as a valid transaction by the correlator, all the tests specified must return a true condition. If this true condition occurs, the parameter name specified in [parameter name] is excluded from a currently selected list of parameter values generated by the correlator. The NA formulation for a rule serves to filter single parameters located within the currently selected list.
end_configuration This syntactical statement denotes the ending of the configuration file.

In an embodiment, the incremental test coverage and cumulative test coverage files comprise BFL statements as shown above in the example in the background description. Another example follows:

Incremental Test Coverage File read(addr=ee, data=eeeeeeee, req_delay=4, ctr_assert_delay=2)
    read(addr=ee, data=eeeeeeee, req_delay=4, ctr_assert_delay=2)
    read(addr=ee, data=eeeeeeee, req_delay=4, ctr_assert_delay=3)
    write(addr=ee, data=eeeeeeee, req_delay=4, ctr_assert_delay=3)

The above BFL statements represent bus transactions captured during the application of test case.

Cumulative Test Coverage File

[FOUND][40]:read(addr=ff, data=eeeeeeee, req_delay=4, ctr_assert_delay=2)
[DUPLICATE][40]:read(addr=ee, data=eeeeeeee, req_delay=4, ctr_assert_delay=2)
[MISSING][0]:read(addr=dd, data=dddddddd, req_delay=2, ctr_assert_delay=2)
[UNKNOWN]:write(addr=ee, data=eeeeeeee, req_delay=4, ctr_assert_delay=3)

The above lines represent BFL statements to which identifying information has been added by the correlator. The identifier "FOUND" indicates that the correlator found a match for a valid transaction that it generated in the incremental test coverage or cumulative test coverage file, meaning that the transaction has been applied and may be incremented to a tally of test coverage.

The identifier "DUPLICATE" indicates that the correlator encountered a transaction that it had already identified as "FOUND".

The identifier "MISSING" indicates that the correlator generated a valid transaction for which it found no match in the incremental test coverage or cumulative test coverage files, meaning that this is a transaction that must be applied in a test case to obtain complete coverage.

The identifier "UNKNOWN" indicates that the correlator encountered a transaction in the incremental test coverage or cumulative test coverage files that it did not recognize.

Figure 2B:
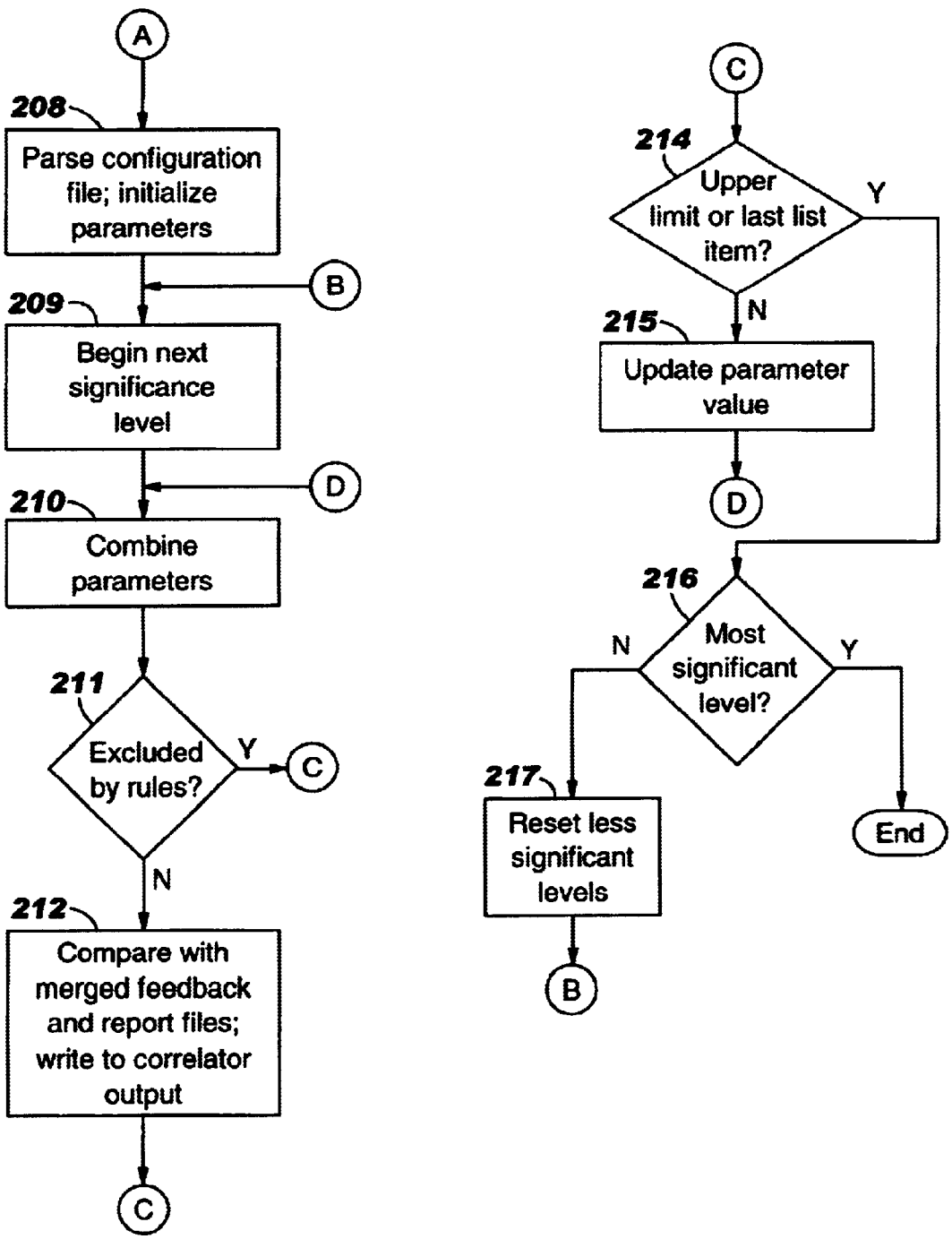
Figure 2C:
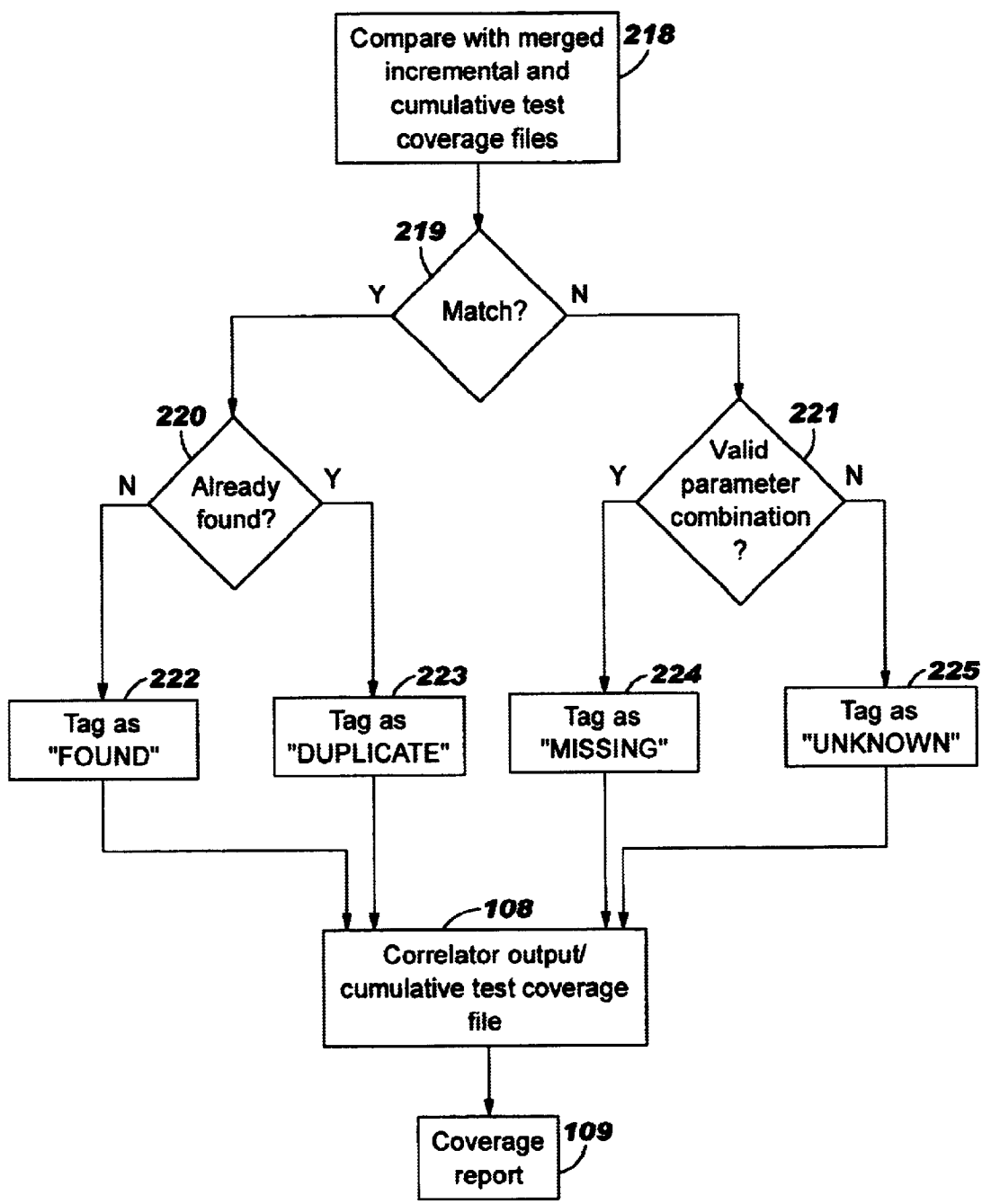

FIGS. 2A–2C show a process flow for the correlator 101, given a DUT configuration file 100 specified in the above-described syntax, a incremental test coverage file 104 and a cumulative test coverage file 108 as input.

As shown in block 200 of FIG. 2A, the correlator reads in the cumulative test coverage file 108. The correlator loops through the cumulative test coverage file to recover only those lines identified as "FOUND" and discard the rest, as shown in blocks 202 through 204. The "FOUND" entries represent cumulative test coverage up to the current execution of the correlator.

Then, as shown in blocks 206–207, the correlator reads in the incremental test coverage file 104 and merges it with the "FOUND" entries.

The correlator then proceeds to generate the valid bus transactions of the DUT and correlate or compare the generated transactions with the merged incremental and cumulative test coverage files. Referring now to FIG. 2B, as shown in block 208, initially the correlator parses the configuration file 100 and initializes parameter values. All range specifications are set to their respective lower limits, or min_values, and all enumeration lists are set to their first listed item.

In order to systematically enumerate each possible parameter combination, the correlator assigns a significance level to each parameter combination specification in a command statement, based on its place in a sequence within the command statement. In an embodiment, the parameter combination specification last in the sequence is the least significant, the next-to-last parameter combination specification is next-to-least significant, and so on up to the first or most significant specification in the sequence.

As shown in block 209, enumeration or generation of parameter combinations begins with the level of least significance (initially the "next" significance level is the least significant level). As shown in block 210, the correlator combines parameter values at each significance level, at their current state, to form a parameter combination.

As each parameter combination in the command statement is generated, it is checked against any rules which may be defined in the configuration file, as shown in block 211. If the generated parameter combination is not excluded by a rule, the parameter combination is correlated or compared with the BFL in the merged cumulative and incremental test coverage files, as shown in block 212. If the combination is excluded by a rule, the flow proceeds to block 214.

FIG. 2C shows a process flow for a possible implementation of block 212. As shown in block 218, the correlator compares a valid bus transaction parameter combination with the merged cumulative and incremental test coverage files. As shown in blocks 219, 220, 222 and 223, if there is a match with a record in the cumulative or incremental test coverage files, the correlates determines whether the record is a duplicate or not, adds the information to the record accordingly, and outputs it to the correlator output 108.

Otherwise, as shown in block 221, it is determined if a valid parameter combination is missing from the incremental and cumulative test coverage files, or if a record is present in the incremental or cumulative test coverage files that does not correspond to a valid parameter combination. If the parameter combination is valid but missing, this information is added to the valid parameter combination and the combination is outputted it to the correlator output, as shown in blocks 224 and 108. If a parameter combination is detected in the incremental or cumulative test coverage files for which there is no match with a valid combination, it is designated "UNKNOWN" and written to the correlator output as shown in blocks 225 and 108.

Returning now to FIG. 2B, at block 214, the correlator checks for whether an upper limit of a specified range has been reached within the current significance level. In the case of an enumeration list, the correlator checks for whether all items of the list have been visited or traversed.

As shown in block 215, if within the current significance level the upper limit of a range has not been reached or all the items of an enumeration list have not been traversed, the parameter value of the range is updated (by step_value if specified or by 1 if not) or the next list item is fetched or visited. Then, the resulting parameter combination is checked against the rules, if any.

When the upper limit of a range is reached or all list items of an enumeration list have been traversed, the correlator moves up to the next significance level. As shown in block 216, if all significance levels have been processed, the correlator is finished and exits. If not, as shown in block 217 the correlator resets all levels of lesser significance than the next level to be processed to their initial values, i.e., to the lower limit of a range or to the first item in an enumeration list, and processes the next level.

It may be observed that the foregoing resembles the functioning of a mileage odometer, in that digits of an odometer, corresponding to significance levels in the above, run through all possible values, beginning with the least significant digit.

The following is an illustrative example of the foregoing enumeration process:
command
    address range x0A x0C
// The above is a command statement in the configuration file syntax. The first and
// most significant parameter combination specification is a range type of
// specification for parameter name=address. The lower limit or min_value for the
// range is x0A, and the upper limit or max_value is x0C. No step value is specified,
// so beginning with the lower limit, the range will be incremented by the default step
// value which is 1;
    be enum 000 111
// The above is an enum or enumeration list type of parameter combination
// specification for parameter name=be (byte enable) comprising two list items, 000
// and 111. This is the least significant parameter combination specification in the
// command statement;
end_command From the above command specification, the correlator would produce the following parameter combinations:
    address=0A, be=000
    address=0A, be=111
    address=0B, be=000
    address=0B, be=111
    address=0C, be=000
    address=0C, be=111

As can be seen, the correlator traversed the least significant level first, pairing each list value with the initial range value, 0A, of the next significance level. Then, the next significance level was processed. The range value was incremented to 0B, the level of lower significance was reset to its initial value, and the correlator produced the next possible combinations. Finally, the upper limit, 0C, of the most significant level was reached and each combination at that level was generated.

The following is an example of application of a rule in a configuration file to the above-described command definition:
rule exclude
    eq address x0C
    eq be 111
end_rule In the above rule specification, the specified tests are that if a parameter combination having an address equal (eq) to x0C and a "be" parameter equal to 111 is generated, the combination is to be excluded, i.e., not considered valid by the correlator. Thus, if this rule was present in the configuration file with the above command definition, the correlator would produce the following valid combinations:
    address=0A, be=000
    address=0A, be=111
    address=0B, be=000
    address=0B, be=111
    address=0C, be=000

It can be seen that, because both tests returned a true condition for the parameter combination "address=0C, be=111", this combination was excluded.

The following are an example incremental test coverage file, DUT configuration file, and resulting correlator output. The cumulative test coverage file may be assumed to have an initialized or empty status:
Incremental Test Coverage File
    read(addr=ee, data=eeeeeeee, req_delay=4, ctr_assert_delay=3)
    read(addr=ee, data=eeeeeeee, req_delay=4, ctr_assert_delay=3)
    read(addr=ee, data=eeeeeeee, req_delay=4, ctr_assert_delay=3)
    write(addr=ee, data=eeeeeeee, req_delay=4, ctr_assert_delay=3)
    read(addr=ff, data=eeeeeeee, req_delay=2, ctr_assert_delay=3)
    read(addr=ff, data=eeeeeeee, req_delay=4, ctr_assert_delay=2)
    read(addr=ff, data=eeeeeeee, req_delay=4, ctr_assert_delay=3)
    read(addr=ff, data=eeeeeeee, req_delay=6, ctr_assert_delay=2)
    read(addr=ff, data=eeeeeeee, req_delay=6, ctr_assert_delay=3)
    read(addr=ff, data=ffffffff, req_delay=2, ctr_assert_delay=2)
    read(addr=ff, data=ffffffff, req_delay=2, ctr_assert_delay=3)
    read(addr=ff, data=ffffffff, req_delay=4, ctr_assert_delay=2)
    read(addr=ff, data=ffffffff, req_delay=4, ctr_assert_delay=3)
    read(addr=ff, data=ffffffff, req_delay=6, ctr_assert_delay=2)
    read(addr=ff, data=ffffffff, req_delay=6, ctr_assert_delay=3)
DUT Configuration File
    configuration dcr_device
    path/dcr_complex/m0/master
    device_type dcr_master
    trans_type
        read
    end_trans_type
        generate
            list read // default that generates a read followed by a write
        end_generate
    command
        addr enum dd ee ff
        data enum dddddddd eeeeeeee ffffffff
        req_delayenum 2 4 6
        ctr_assert_delay enum 2 3
    end_command
    end_configuration
Correlator Output (Cumulative Test Coverage) File
[FOUND][40]:read(addr=ee, data=eeeeeeee, req_delay=4, ctr_assert_delay=3)
[DUPLICATE][40]:read(addr=ee, data=eeeeeeee, req_delay=4, ctr_assert_delay=3)

[DUPLICATE][40]:read(addr=ee, data=eeeeeeee, req_delay=4, ctr_assert_delay=3)
[UNKNOWN]:write(addr=ee, data=eeeeeeee, req_delay=4, ctr_assert_delay=3)
[FOUND][64]:read(addr=ff, data=eeeeeeee, req_delay=2, ctr_assert_delay=3)
[FOUND][66]:read(addr=ff, data=eeeeeeee, req_delay=4, ctr_assert_delay=2)
[FOUND][67]:read(addr=ff, data=eeeeeeee, req_delay=4, ctr_assert_delay=3)
[FOUND][69]:read(addr=ff, data=eeeeeeee, req_delay=6, ctr_assert_delay=2)
[FOUND][70]:read(addr=ff, data=eeeeeeee, req_delay=6, ctr_assert_delay=3)
[FOUND][72]:read(addr=ff, data=ffffffff, req_delay=2, ctr_assert_delay=2)
[FOUND][73]:read(addr=ff, data=ffffffff, req_delay=2, ctr_assert_delay=3)
[FOUND][75]:read(addr=ff, data=ffffffff, req_delay=4, ctr_assert_delay=2)
[FOUND][76]:read(addr=ff, data=ffffffff, req_delay=4, ctr_assert_delay=3)
[FOUND][78]:read(addr=ff, data=ffffffff, req_delay=6, ctr_assert_$_{delay=}$2)
[FOUND][79]:read(addr=ff, data=ffffffff, req_delay=6, ctr_assert_delay=3)
[MISSING][0]:read(addr_dd, data=dddddddd, req_delay=2, ctr_assert_delay=2)
[MISSING][1]:read(addr=dd, data=dddddddd, req_delay=2, ctr_assert_delay=31)
[MISSING][2]:read(addr=dd, data=dddddddd, req_delay=2)
[MISSING][3]:read(addr=dd, data=dddddddd, req_delay=4, ctr_assert_delay=2)
[MISSING][4]:read(addr=dd, data=dddddddd, req-delay=4, ctr-assert-delay=3)
[MISSING][5]:read(addr=dd, data=dddddddd, req_delay=4)
[MISSING][6]:read(addr=dd, data=dddddddd, req_delay=6, ctr_assert_delay=2)
[MISSING][7]:read(addr=dd, data=dddddddd, req_delay=6, ctr_assert_delay=3)
[MISSING][8]:read(addr_dd, data=dddddddd, req_delay=6)
[MISSING][9]:read(addr=dd, data=eeeeeeee, req_delay=2, ctr_assert_delay=2)
[MISSING][10]:read(addr=dd, data=eeeeeeee, req_delay=2, ctr_assert_delay=3)
[MISSING][11]:read(addr=dd, data=eeeeeeee, req_delay=2)
[MISSING][12]:read(addr=dd, data=eeeeeeee, req_delay=4, ctr_assert_delay=2)
[MISSING][13]:read(addr=dd, data=eeeeeeee, req_delay=4, ctr_assert_delay=3)
[MISSING][14]:read(addr=dd, data=eeeeeeee, req_delay=4)
[MISSING][15]:read(addr=dd, data=eeeeeeee, req_delay=6, ctr_assert_delay=2)
[MISSING][16]:read(addr=dd, data=eeeeeeee, req_delay=6, ctr_assert_delay=3)
[MISSING][17]:read(addr=dd, data=eeeeeeee, req_delay=6)
[MISSING][18]:read(addr=dd, data=ffffffff, req_delay=2, ctr_assert_delay=2)
[MISSING][19]:read(addr=dd, data=ffffffff, req_delay=2, ctr_assert_delay=3)
[MISSING][20]:read(addr=dd, data=ffffffff, req_delay=2)
[MISSING][21]:read(addr=dd, data=ffffffff, req-delay=4, ctr_assert_delay=2)
[MISSING][22]:read(addr=dd, data=ffffffff, req_delay=4, ctr_assert_delay=3)
[MISSING][23]:read(addr=dd, data=ffffffff, req_delay=4)
[MISSING][24]:read(addr=dd, data=ffffffff, req_delay=6, ctr_assert_delay=2)
[MISSING][25]:read(addr=dd, data=ffffffff, req_delay=6, ctr_assert_delay=3)
[MISSING][26]:read(addr=dd, data=ffffffff, req_delay=6)
[MISSING][27]:read(addr=ee, data=dddddddd, req_delay=2, ctr_assert_delay=2)
[MISSING][28]:read(addr=ee, data=dddddddd, req_delay=2, ctr_assert_delay=3)
[MISSING][29]:read(addr=ee, data=dddddddd, req_delay=2)
[MISSING][30]:read(addr=ee, data=dddddddd, req_delay=4, ctr_assert_delay=2)
[MISSING][31]:read(addr=ee, data=dddddddd, req_delay=4, ctr_assert_delay=3)
[MISSING][32]:read(addr=ee, data=dddddddd, req_delay=4)
[MISSING][33]:read(addr=ee, data=dddddddd, req_delay=6, ctr_assert_delay=2)
[MISSING][34]:read(addr=ee, data=dddddddd, req_delay=6, ctr_assert_delay=3)
[MISSING][35]:read(addr=ee, data=dddddddd, req_delay=6)
[MISSING][36]:read(addr=ee, data=eeeeeeee, req_delay=2, ctr_assert_delay=2)
[MISSING][37]:read(addr=ee, data=eeeeeeee, req_delay=2, ctr_assert_delay=3)
[MISSING][38]:read(addr=ee, data=eeeeeeee, req_delay=2)
[MISSING][39]:read(addr=ee, data=eeeeeeee, req_delay=4, ctr_assert_delay=2)
[MISSING][41]:read(addr=ee, data=eeeeeeee, req_delay=4)
[MISSING][42]:read(addr=ee, data=eeeeeeee, req_delay=6, ctr_assert_delay=2)
[MISSING][43]:read(addr=ee, data=eeeeeeee, req_delay=6, ctr_assert_delay=3)
[MISSING][44]:read(addr=ee, data=eeeeeeee, req_delay=6)
[MISSING][45]:read(addr=ee, data=ffffffff, req_delay=2, ctr_assert_delay=2)
[MISSING][46]:read(addr=ee, data=ffffffff, req_delay=2, ctr_assert_delay=3)
[MISSING][47]:read(addr=ee, data=ffffffff, req_delay=2)
[MISSING][48]:read(addr=ee, data=ffffffff, req_delay=4, ctr_assert_delay=2)
[MISSING][49]:read(addr=ee, data=ffffffff, req_delay=4, ctr_assert_delay=3)
[MISSING][50]:read(addr=ee, data=ffffffff, req_delay=4)
[MISSING][51]:read(addr=ee, data=ffffffff, req_delay=6, ctr_assert_delay=2)
[MISSING][52]:read(addr=ee, data=ffffffff, req_delay=6, ctr_assert_delay=3)
[MISSING][53]:read(addr=ee, data=ffffffff, req_delay=6)
[MISSING][54]:read(addr=ff, data=dddddddd, req_delay=2, ctr_assert_delay=2)
[MISSING][55]:read(addr=ff, data=dddddddd, req_delay=2, ctr_assert_delay=3)
[MISSING][56]:read(addr=ff, data=dddddddd, req_delay=2)
[MISSING][57]:read(addr=ff, data=dddddddd, req-delay=4, ctr_assert_delay=2)

[MISSING][58]:read(addr=ff, data=dddddddd, req-delay=4, ctr_assert_delay=3)
[MISSING][59]:read(addr=ff, data=dddddddd, req_delay=4)
[MISSING][60]:read(addr=ff, data=dddddddd, req_delay=6, ctr_assert_delay=2)
[MISSING][61]:read(addr=ff, data=dddddddd, req_delay=6, ctr_assert_delay=3)
[MISSING][62]:read(addr=ff, data=dddddddd, req_delay=6)
[MISSING][63]:read(addr=ff, data=eeeeeeee, req_delay=2, ctr_assert_delay=2)
[MISSING][65]:read(addr=ff, data=eeeeeeee, req_delay=2)
[MISSING][68]:read(addr=ff, data=eeeeeeee, req_delay=4)
[MISSING][71]:read(addr=ff, data=eeeeeeee, req_delay=6)
[MISSING][74]:read(addr=ff, data=ffffffff, req_delay=2)
[MISSING][77]:read(addr=ff, data=ffffffff, req_delay=4)
[MISSING][80]:read(addr=ff, data=ffffffff, req_delay=4)

It can be seen from the first three lines of the correlator output that the correlator detected a valid transaction in the incremental test coverage file, and then two duplicates of that transaction. The fourth line identifies the write transaction in the incremental test coverage file as "UNKNOWN", since the DUT configuration file only generated read transactions.

The lines following the "UNKNOWN" transaction and identified as "FOUND" can be seen to correspond to each of the BFL statements of the incremental test coverage file. These transactions can be accreted toward total test coverage.

The lines identified as "MISSING" can be seen to correspond to parameter combinations generated by the correlator from the example DUT configuration file, but which were absent from the incremental test coverage file. These are transactions which must be applied in a test cases or cases to provide complete coverage.

Figure 3:
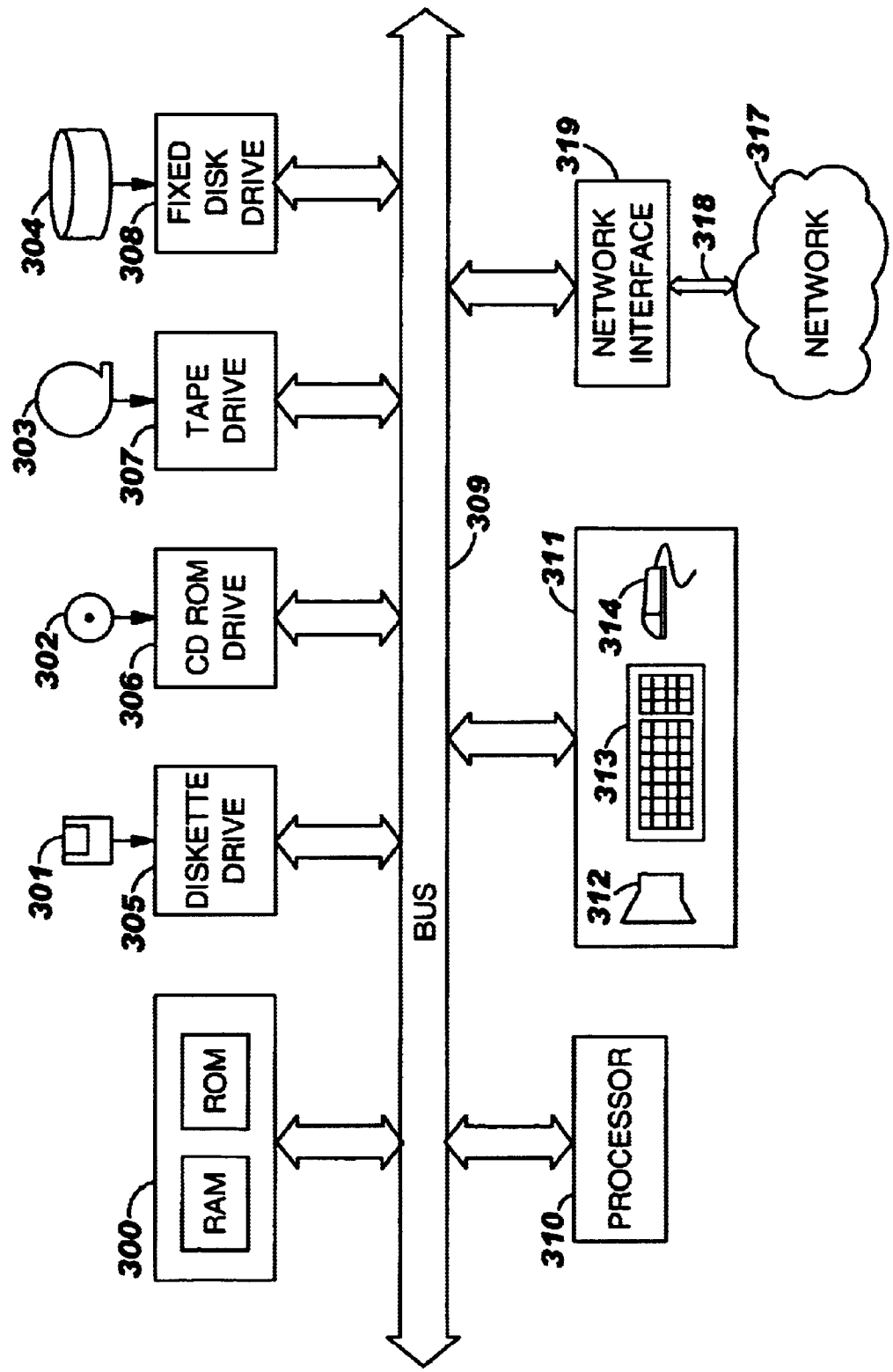
FIG. 3 shows a computer system for practicing the invention.

FIG. 3 shows a high-level representation of a computer system for implementing a preferred embodiment of the present invention, such as might be realized by a variety of known and commercially available hardware and software elements as embodied in, for example, a UNIX® workstation. The system comprises a memory 300 including ROM and RAM, processor 310 and user interface 311 comprising a video display 312, keyboard 313 and mouse 314. Elements may communicate via system bus 309. The system may further comprise a network 317 connected by a network medium 318 and network interface 319.

A computer program or collection of programs comprising computer-executable instructions for performing method steps according to the present invention may be stored and transported on computer-usable media such as diskette 301, CD-ROM 302, magnetic tape 303 and fixed disk 304. To perform the steps of the method, computer instructions according to the present invention may be retrieved from the computer-usable media 301–304 using their respective drives 305–308 into memory 300, and executed by a processor 310. The process steps and functionality disclosed hereinabove for performing the method may find specific implementations in a variety of forms, which are considered to be within the abilities of a programmer of ordinary skill in the art after having reviewed the specification.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method comprising:
    collecting incremental test coverage information from an application of a test case to a design-under-test (DUT);
    providing cumulative test coverage information for said DUT;
    providing a set of valid bus transactions for said DUT; and
    correlating said valid bus transactions with said incremental and cumulative test coverage information to determine an extent of test coverage for said DUT wherein said correlating step generates said valid bus transaction form a DUT configuration file describing said DUT in terms of its bus transactions in a condensed syntax.

2. The method of claim 1 wherein said correlating step comprises comparing said set of valid bus transactions with said coverage information to determine whether said set has been applied to said DUT in a test case.

3. The method of claim 1 wherein said correlating step comprises:
    identifying valid bus transactions present in said coverage information; and
    identifying valid bus transactions absent from said coverage information.

4. The method of claim 1 wherein said configuration file includes parameter combination specifications corresponding to said DUT, and rules for excluding parameter combinations generated by said correlating step.

5. A method comprising:
    providing incremental and cumulative test coverage information for a DUT;
    generating a set of valid bus transactions for said DUT from a DUT configuration file describing said DUT in terms of its bus transactions in a condensed syntax;
    correlating said set of valid bus transactions with said incremental and cumulative test coverage information to determine an extent of test coverage for said DUT; and
    adding correlation information obtained from said correlating step to said cumulative test coverage information.

6. The method of claim 5, wherein said correlation information identifies valid bus transactions absent from said incremental and cumulative test coverage information.

7. The method of claim 5, wherein said correlating step enumerates possible bus transactions for said DUT from said configuration file.

8. The method of claim 7, wherein said configuration file includes rules for filtering out selected ones of said possible bus transactions.

9. A computer-usable medium storing computer-executable instructions, said instructions when executed implementing a process comprising:

correlating valid bus transactions for a DUT with incremental and cumulative test coverage information for said DUT wherein said correlating step generates said valid bus transaction from a DUT configuration file describing said DUT in terms of its bus transactions in a condensed syntax; and determining an extent of test coverage for said DUT from said correlating.

10. The computer-usable medium of claim 9, said correlating step comprising generating possible bus transactions from a configuration file describing said DUT.

11. The computer-usable medium of claim 10, said correlating step further comprising applying rules for excluding selected ones of said possible transactions to obtain said valid transactions.

12. The computer-usable medium of claim 9, wherein said determining step determines the presence or absence of said valid transactions from said test coverage information.

13. A system comprising:

a memory storing computer-executable instructions;

a processor coupled to said memory for executing said instructions;

an incremental test coverage file;

a cumulative test coverage file; and a configuration file describing a DUT in terms of its bus transactions in a condensed syntax;

said instructions when executed correlating bus transactions generated from said configuration file with said incremental and cumulative test coverage files to determine an extent of test coverage for said DUT.

14. The system of claim 13, wherein said instructions generate information from said incremental and cumulative files, said information relating to whether or not valid bus transactions are included in said incremental and cumulative test coverage files.

15. The system of claim 13, said configuration file further comprising rules for filtering out selected ones of said possible bus transactions to obtain a valid transaction set for correlating with said incremental and cumulative test coverage files.

* * * * *